United States Patent
Kang (10) Patent No.: US 11,223,503 B2
(45) Date of Patent: Jan. 11, 2022

(54) SIGNAL RECEIVER CIRCUIT, AND SEMICONDUCTOR APPARATUS AND SEMICONDUCTOR SYSTEM INCLUDING THE SIGNAL RECEIVER CIRCUIT

(71) Applicant: SK hynix Inc., Icheon-si (KR)

(72) Inventor: Ji Hyo Kang, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/572,154

(22) Filed: Sep. 16, 2019

(65) Prior Publication Data

US 2020/0274741 A1 Aug. 27, 2020

(30) Foreign Application Priority Data

Feb. 26, 2019 (KR) .......................... 10-2019-0022635

(51) Int. Cl.
*H04L 25/02* (2006.01)
*H03F 3/45* (2006.01)

(52) U.S. Cl.
CPC ..... *H04L 25/0296* (2013.01); *H03F 3/45475* (2013.01)

(58) Field of Classification Search
CPC ............. H03F 3/45475; H04L 25/0926; H04L 25/0924; H04L 25/092
See application file for complete search history.

(56) References Cited

U.S. PATENT DOCUMENTS

| 9,041,447 B2 * | 5/2015 | Hwang | H04L 27/01 327/108 |
| 10,153,742 B2 * | 12/2018 | Corbishley | H03F 3/45188 |
| 2006/0181348 A1 * | 8/2006 | Dreps | G11C 7/1084 330/254 |
| 2012/0194273 A1 * | 8/2012 | Chuang | H03F 3/45183 330/253 |
| 2014/0269130 A1 * | 9/2014 | Maeng | G11C 7/1084 365/207 |
| 2014/0314173 A1 * | 10/2014 | Hekmat | H04L 25/4919 375/287 |
| 2016/0028378 A1 * | 1/2016 | Moriuchi | H03K 3/356139 327/64 |

FOREIGN PATENT DOCUMENTS

KR 100400224 B1 10/2003
KR 1020200051890 A 5/2020

* cited by examiner

*Primary Examiner* — Patrick C Chen
(74) *Attorney, Agent, or Firm* — William Park & Associates Ltd.

(57) ABSTRACT

A signal receiver circuit includes a first amplification circuit and an offset compensation circuit. The first amplification circuit generates a first amplified signal and a second amplified signal by amplifying an input signal and a reference voltage. The offset compensation circuit adjusts voltage levels of the first and second amplified signals based on a DC level of the input signal and a voltage level of the reference voltage.

26 Claims, 7 Drawing Sheets

SIGNAL RECEIVER CIRCUIT, AND SEMICONDUCTOR APPARATUS AND SEMICONDUCTOR SYSTEM INCLUDING THE SIGNAL RECEIVER CIRCUIT

CROSS-REFERENCES TO RELATED APPLICATION

The present application claims priority under 35 U.S.C. § 119(a) to Korean application number 10-2019-0022635, filed on Feb. 26, 2019, in the Korean Intellectual Property Office, which is incorporated herein by reference in its entirety.

BACKGROUND

1. Technical Field

Various embodiments generally relate to an integrated circuit technology, and more particularly, to a semiconductor apparatus and a semiconductor system including a signal receiver circuit.

2. Related Art

Each of electronic apparatuses may include a large number of electronic components. Among the electronic apparatuses, a computer system may include a large number of semiconductor apparatuses which are constructed by semiconductors. The semiconductor apparatuses which construct the computer system may communicate with one another by transmitting or receiving a clock and data. Each of semiconductor apparatuses may include a signal receiver circuit to receive a signal transmitted from an external apparatus or receive a signal transmitted from an internal circuit in the semiconductor apparatus. The signal receiver circuit may receive a transmitted signal by performing a differential amplification operation. The signal receiver circuit may receive differential signals or a single-ended signal. The signal receiver circuit uses a reference voltage to receive a single-ended signal. When the signal receiver circuit receives differential signals, because one input signal has a level complementary to that of the other input signal, the amplification circuit may amplify accurate signals by compensating for the high frequency loss of a channel, reflection and inter-symbol interference (ISI) due to crosstalk and increasing an AC gain. However, when the signal receiver circuit receives a single-ended signal, because the single-ended signal as one input signal swings in its voltage level but the reference voltage as the other input signal maintains a predetermined voltage level, a problem may be caused in that the common mode of the amplification circuit drifts or an AC gain decreases. Moreover, in the case where an offset between the single-ended signal and the reference voltage increases, the signal receiver circuit might not generate an output signal corresponding to the single-ended signal.

SUMMARY

In an embodiment, a signal receiver circuit may include a first amplification circuit, a voltage adjusting circuit, and a bias signal generation circuit. The first amplification circuit may be configured to amplify an input signal and a reference voltage to output a first amplified signal through a first amplification node and output a second amplified signal through a second amplification node. The voltage adjusting circuit may be configured to change a voltage level of the first amplified signal based on the second amplified signal and a first bias signal, and change a voltage level of the second amplified signal based on the first amplified signal and a second bias signal. The bias signal generation circuit may be configured to compare a DC level of the input signal and the reference voltage to generate the first bias signal and the second bias signal.

In an embodiment, a signal receiver circuit may include a first amplification circuit, a second amplification circuit, a bias signal generation circuit, and a voltage adjusting circuit. The first amplification circuit may be configured to amplify an input signal and a reference voltage to generate a first amplified signal through a first amplification node and generate a second amplified signal through a second amplification node. The second amplification circuit may be configured to amplify the first amplified signal and the second amplified signal to generate a first output signal and a second output signal. The bias signal generation circuit may be configured to compare a DC level of the input signal and the reference voltage to generate a first bias signal and a second bias signal. The voltage adjusting circuit may be configured to change voltage levels of the first and second amplified signals based on the first amplified signal, the second amplified signal, the first bias signal and the second bias signal.

In an embodiment, a signal receiver circuit may include a first amplification circuit, a second amplification circuit, and an offset compensation circuit. The first amplification circuit may be configured to amplify an input signal and a reference voltage to generate a first amplified signal and a second amplified signal. The second amplification circuit may be configured to amplify the first amplified signal and the second amplified signal to generate a first output signal and a second output signal. The offset compensation circuit may be configured to adjust voltage levels of the first and second amplified signals based on an offset between a DC level of the input signal and a voltage level of the reference voltage.

DETAILED DESCRIPTION

Hereinafter, a signal receiver circuit, and a semiconductor apparatus and semiconductor system including the same will be described below with reference to the accompanying drawings through various examples of embodiments.

The word "coupled," as used herein for some embodiments, means that two components are directly connected with one another. For example, a first component coupled to a second component means the first component is contacting the second component. For other embodiments, coupled components have one or more intervening components. For example, a first component is coupled to a second component when the first and second components are both in contact with a common third component even though the first component is not directly contacting the second component.

Figure 1:
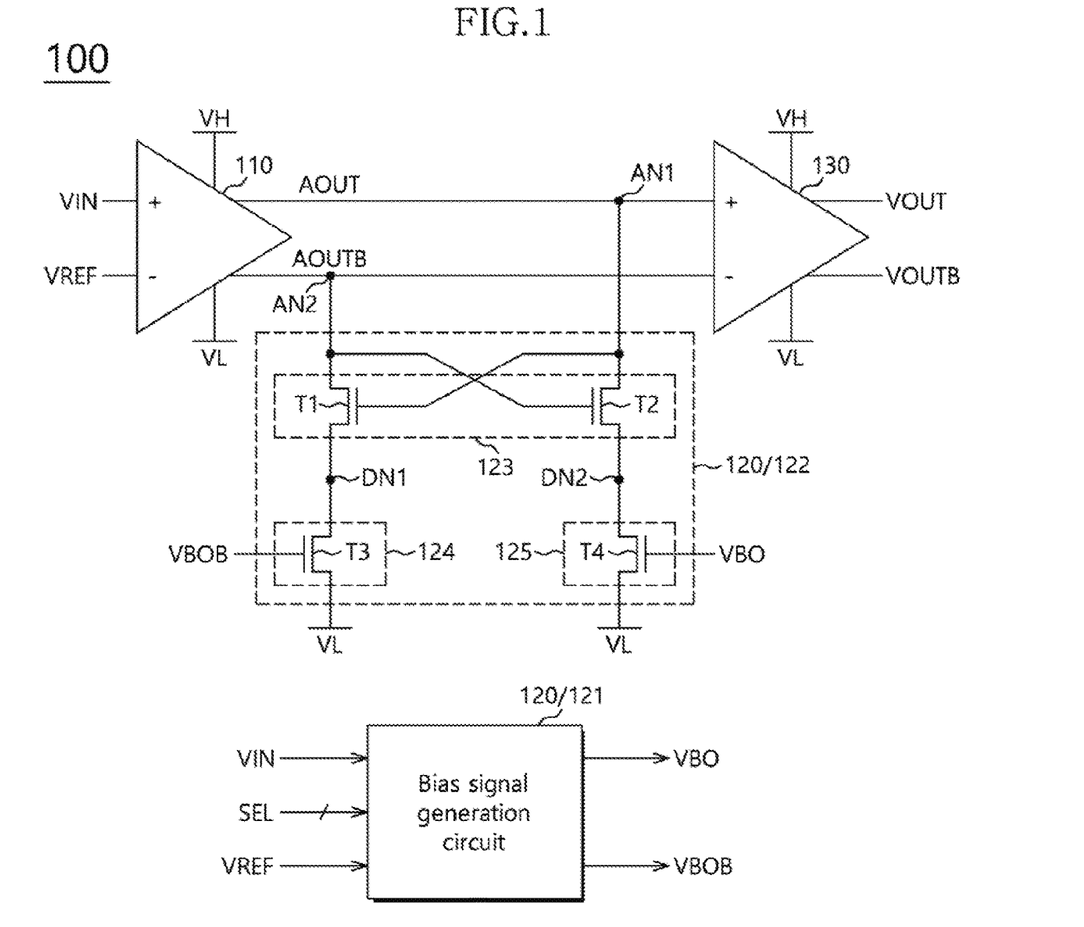
FIG. 1 is a diagram illustrating a configuration of a signal receiver circuit in accordance with an embodiment.

FIG. 1 is a diagram illustrating a configuration of a signal receiver circuit 100 in accordance with an embodiment. Referring to FIG. 1, the signal receiver circuit 100 may receive an input signal VIN and generate a first amplified signal AOUT and a second amplified signal AOUTB. The input signal VIN may be inputted to the signal receiver circuit 100 as a single-ended signal. The signal receiver circuit 100 may use a reference voltage VREF to receive the input signal VIN. The reference voltage VREF may have a voltage level corresponding to the middle between a maximum voltage level and a minimum voltage level to which the input signal VIN can swing. The signal receiver circuit 100 may generate the first and second amplified signals AOUT and AOUTB by differentially amplifying the input signal VIN and the reference voltage VREF. The second amplified signal AOUTB may be a complementary signal of the first amplified signal AOUT. In an embodiment, the signal receiver circuit 100 may generate the first amplified signal AOUT and the second amplified signal AOUTB by amplifying differential signals. The signal receiver circuit 100 may receive the input signal VIN and a complementary signal of the input signal VIN as differential signals, and may generate the first and second amplified signals AOUT and AOUTB by amplifying the input signal VIN and the complementary signal of the input signal VIN.

The signal receiver circuit 100 may include a first amplification circuit 110 and an offset compensation circuit 120. The first amplification circuit 110 may receive the input signal VIN and the reference voltage VREF, and may generate the first amplified signal AOUT and the second amplified signal AOUTB by amplifying the input signal VIN and the reference voltage VREF. The first amplification circuit 110 may include a differential amplifier which is coupled between a first power supply voltage terminal and a second power supply voltage terminal and differentially amplifies the input signal VIN and the reference voltage VREF. The first power supply voltage terminal may receive a first power supply voltage VH, and the second power supply voltage terminal may receive a second power supply voltage VL. The first power supply voltage VH may have a level higher than the second power supply voltage VL. The first power supply voltage VH may be an operating power supply voltage of a semiconductor apparatus including the signal receiver circuit 100. The second power supply voltage VL may be, for example, a ground voltage. The first amplification circuit 110 may output the first amplified signal AOUT through a first amplification node AN1, and may output the second amplified signal AOUTB through a second amplification node AN2.

The offset compensation circuit 120 may control voltage levels of the first and second amplified signals AOUT and AOUTB based on the input signal VIN and the reference voltage VREF. The offset compensation circuit 120 may adjust voltage levels of the first and second amplified signals AOUT and AOUTB based on an offset between a DC (direct current) level of the input signal VIN and a voltage level of the reference voltage VREF. A DC level of the input signal VIN may vary depending on the characteristic of a signal transmission line, a channel or a bus through which the input signal VIN is transmitted. Because the reference voltage VREF is set to have a level corresponding to the middle of a range through which the input signal VIN can swing, ideally, a DC level of the input signal VIN and a voltage level of the reference voltage VREF may be the same with each other. However, because the swing range of the input signal VIN may vary depending on the characteristic of a signal transmission line, a channel or a bus through which the input signal VIN is transmitted and a level of the reference voltage VREF may also vary, an offset may occur between a DC level of the input signal VIN and a voltage level of the reference voltage VREF. The offset may cause a problem in that a margin for amplifying the input signal VIN may be decreased and an amplified signal corresponding to the input signal VIN might not be accurately generated. Also, the offset may deteriorate a duty ratio of an amplified signal. The offset compensation circuit 120 may cause the first amplified signal AOUT to be generated at a logic level corresponding to the input signal VIN, by compensating voltage levels of the first and second amplified signals AOUT and AOUTB based on an offset between a DC level of the input signal VIN and a voltage level of the reference voltage VREF, and thereby, may improve a duty ratio of the first amplified signal AOUT.

The signal receiver circuit 100 may further include a second amplification circuit 130. The second amplification circuit 130 may be coupled with the first amplification node AN1 and the second amplification node AN2, and may receive the first amplified signal AOUT and the second amplified signal AOUTB. The second amplification circuit 130 may generate a first output signal VOUT and a second output signal VOUTB by amplifying the first amplified signal AOUT and the second amplified signal AOUTB. The second output signal VOUTB may be a complementary signal of the first output signal VOUT. The second amplification circuit 130 may include a differential amplifier which is coupled between the first power supply voltage terminal receiving the first power supply voltage VH and the second power supply voltage terminal receiving the second power supply voltage VL and differentially amplifies the first amplified signal AOUT and the second amplified signal AOUTB.

Referring to FIG. 1, the offset compensation circuit 120 may include a bias signal generation circuit 121 and a voltage adjusting circuit 122. The bias signal generation circuit 121 may generate a first bias signal VBO and a second bias signal VBOB based on an offset between a DC level of the input signal VIN and a voltage level of the reference voltage VREF. The first and second bias signals VBO and VBOB may be analog signals which have voltage levels changing depending on the offset. The bias signal generation circuit 121 may receive the input signal VIN and the reference voltage VREF, and may generate the first and second bias signals VBO and VBOB based on the input signal VIN and the reference voltage VREF. The bias signal generation circuit 121 may generate a DC level signal VINDC by detecting a DC level of the input signal VIN, and may generate the first and second bias signals VBO and VBOB by comparing the DC level signal VINDC and a voltage level of the reference voltage VREF.

Alternatively, the bias signal generation circuit 121 may receive a select signal SEL instead of the input signal VIN, and may generate the first and second bias signals VBO and VBOB based on the select signal SEL and the reference voltage VREF. The select signal SEL may generate an optional voltage as the DC level signal VINDC of the input signal VIN. The select signal SEL may be an optional control signal which may be generated in consideration of the characteristic of a signal transmission line, a channel or a bus through which the input signal VIN is transmitted. The select signal SEL may predict a change in a DC level of the input signal VIN depending on the environment of the signal transmission line, the channel or the bus, and may include an information which can select a predicted DC level. The bias signal generation circuit 121 may generate the first and second bias signals VBO and VBOB by comparing the DC level signal VINDC generated based on the select signal SEL and the reference voltage VREF.

The voltage adjusting circuit 122 may be coupled between the first and second amplification nodes AN1 and AN2 and the second power supply voltage terminal which receives the second power supply voltage VL. The voltage adjusting circuit 122 may receive the first and second amplified signals AOUT and AOUTB through the first and second amplification nodes AN1 and AN2. The voltage adjusting circuit 122 may receive the first and second bias signals VBO and VBOB. The voltage adjusting circuit 122 may adjust the voltage levels of the first and second amplified signals AOUT and AOUTB based on the first amplified signal AOUT, the second amplified signal AOUTB, the first bias signal VBO and the second bias signal VBOB. The voltage adjusting circuit 122 may change a voltage level of the second amplified signal AOUTB based on the first amplified signal AOUT and the second bias signal VBOB. The voltage adjusting circuit 122 may change a voltage level of the first amplified signal AOUT based on the second amplified signal AOUTB and the first bias signal VBO.

The voltage adjusting circuit 122 may include a cross-coupling circuit 123, a first current circuit 124 and a second current circuit 125. The cross-coupling circuit 123 may be coupled between the first amplification node AN1, the second amplification node AN2, a first discharge node DN1 and a second discharge node DN2. The cross-coupling circuit 123 may couple the second amplification node AN2 with the first discharge node DN1 based on the first amplified signal AOUT. The cross-coupling circuit 123 may couple the first amplification node AN1 with the second discharge node DN2 based on the second amplified signal AOUTB. The cross-coupling circuit 123 may include a first transistor T1 and a second transistor T2. The first and second transistors T1 and T2 may be N-channel MOS transistors. The first transistor T1 may be coupled between the second amplification node AN2 and the first discharge node DN1, and may have a gate which is coupled with the first amplification node AN1 and receives the first amplified signal AOUT. The second transistor T2 may be coupled between the first amplification node AN1 and the second discharge node DN2, and may have a gate which is coupled with the second amplification node AN2 and receives the second amplified signal AOUTB.

The first current circuit 124 may be coupled between the first discharge node DN1 and the second power supply voltage terminal. The first current circuit 124 may receive the second bias signal VBOB, and may change an amount of current flowing to the second power supply voltage terminal from the first discharge node DN1 based on the second bias signal VBOB. The second current circuit 125 may be coupled between the second discharge node DN2 and the second power supply voltage terminal. The second current circuit 125 may receive the first bias signal VBO, and may change an amount of current flowing to the second power supply voltage terminal from the second discharge node DN2 based on the first bias signal VBO.

The first current circuit 124 may include a third transistor T3. The third transistor T3 may be an N-channel MOS transistor. The third transistor T3 may be coupled between the first discharge node DN1 and the second power supply voltage terminal, and may have a gate which receives the second bias signal VBOB. The second current circuit 125 may include a fourth transistor T4. The fourth transistor T4 may be an N-channel MOS transistor. The fourth transistor T4 may be coupled between the second discharge node DN2 and the second power supply voltage terminal, and may have a gate which receives the first bias signal VBO.

Figure 2:
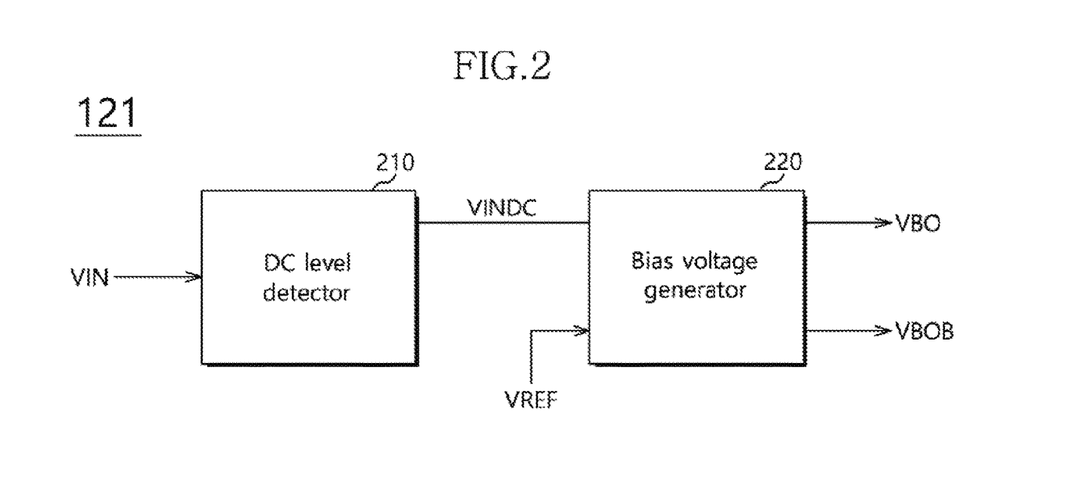
FIG. 2 is a diagram illustrating a configuration of the bias signal generation circuit illustrated in FIG. 1.

FIG. 2 is a diagram illustrating a configuration of the bias signal generation circuit 121 illustrated in FIG. 1. Referring to FIG. 2, the bias signal generation circuit 121 may include a DC level detector 210 and a bias voltage generator 220. The DC level detector 210 may receive the input signal VIN, and thereby, may generate the DC level signal VINDC of the input signal VIN. The DC level detector 210 may generate the DC level signal VINDC by detecting a DC level of the input signal VIN. For example, the DC level detector 210 may generate the DC level signal VINDC which has a voltage level corresponding to the middle between a maximum voltage and a minimum voltage of the input signal VIN which is received.

The bias voltage generator 220 may receive the DC level signal VINDC and the reference voltage VREF. The bias voltage generator 220 may generate the first bias signal VBO and the second bias signal VBOB based on the DC level signal VINDC and the reference voltage VREF. The bias voltage generator 220 may generate the first bias signal VBO and the second bias signal VBOB which have various voltage levels depending on differences in polarity and level between a voltage level of the DC level signal VINDC and a voltage level of the reference voltage VREF.

Figure 3:
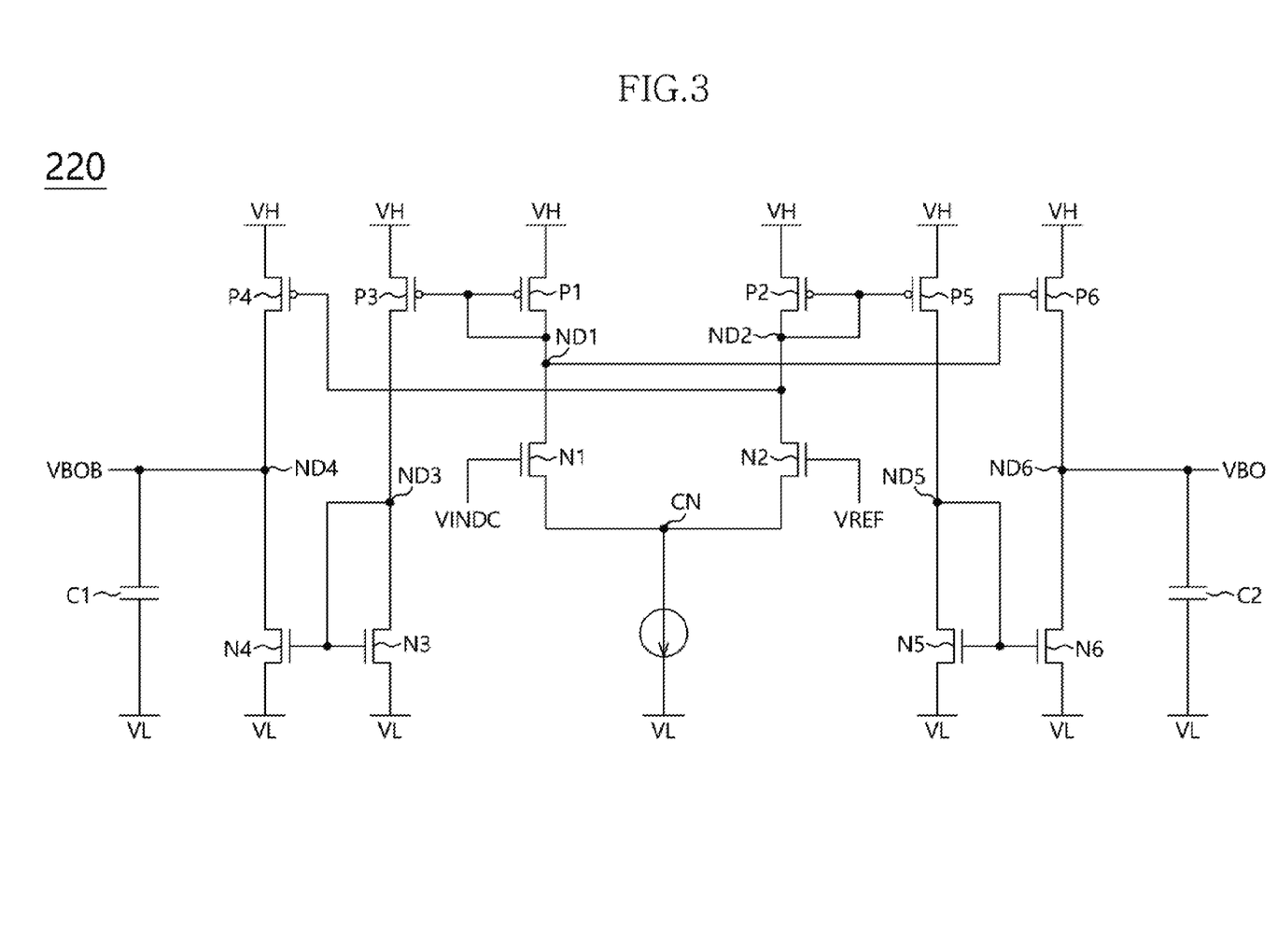
FIG. 3 is a diagram illustrating a configuration of the bias voltage generator illustrated in FIG. 2.

FIG. 3 is a diagram illustrating a configuration of the bias voltage generator 220 illustrated in FIG. 2. Referring to FIG. 3, the bias voltage generator 220 may include first to sixth NMOS transistors N1, N2, N3, N4, N5 and N6 and first to sixth PMOS transistors P1, P2, P3, P4, P5 and P6. The first NMOS transistor N1 may be coupled between a first node ND1 and a common node CN, and may have a gate which receives the DC level signal VINDC. The second NMOS transistor N2 may be coupled between a second node ND2 and the common node CN, and may have a gate which receives the reference voltage VREF. The common node CN may be coupled with the second power supply voltage terminal which receives the second power supply voltage VL, through a current source. The first PMOS transistor P1 may be coupled between the first power supply voltage terminal which receives the first power supply voltage VH and the first node ND1, and may have a gate which is coupled with the first node ND1. The second PMOS transistor P2 may be coupled between the first power supply voltage terminal and the second node ND2, and may have a gate which is coupled with the second node ND2. The first and second NMOS transistors N1 and N2 and the first and second PMOS transistors P1 and P2 may form a differential amplifier, and thereby, may output a signal corresponding to a voltage level of the reference voltage VREF through the first node ND1 and output a signal corresponding to a voltage level of the DC level signal VINDC through the second node ND2.

The third PMOS transistor P3 may be coupled between the first power supply voltage terminal and a third node ND3, and may have a gate which is coupled with the first node ND1. The fourth PMOS transistor P4 may be coupled between the first power supply voltage terminal and a fourth node ND4, and may have a gate which is coupled with the second node ND2. The third PMOS transistor P3 is coupled in common to the first node ND1 together with the first PMOS transistor P1, and causes current corresponding to current flowing through the first node ND1 to flow through the third node ND3. The fourth PMOS transistor P4 is coupled in common to the second node ND2 together with the second PMOS transistor P2, and causes current corresponding to current flowing through the second node ND2 to flow through the fourth node ND4. The third NMOS transistor N3 may be coupled between the third node ND3 and the second power supply voltage terminal, and may have a gate which is coupled with the third node ND3. The fourth NMOS transistor N4 may be coupled between the fourth node ND4 and the second power supply voltage terminal, and may have a gate which is coupled with the third node ND3. The fourth NMOS transistor N4 may change a voltage level of the fourth node ND4 depending on a change in a voltage level of the third node ND3, and may generate the second bias signal VBOB through the fourth node ND4. A first capacitor C1 for stabilizing a voltage level of the second bias signal VBOB may be coupled between the fourth node ND4 and the second power supply voltage terminal.

The fifth PMOS transistor P5 may be coupled between the first power supply voltage terminal and a fifth node ND5, and may have a gate which is coupled with the second node ND2. The sixth PMOS transistor P6 may be coupled between the first power supply voltage terminal and a sixth node ND6, and may have a gate which is coupled with the first node ND1. The fifth PMOS transistor P5 is coupled in common to the second node ND2 together with the second PMOS transistor P2, and causes current corresponding to current flowing through the second node ND2 to flow through the fifth node ND5. The sixth PMOS transistor P6 is coupled in common to the first node ND1 together with the first PMOS transistor P1, and causes current corresponding to current flowing through the first node ND1 to flow through the sixth node ND6. The fifth NMOS transistor N5 may be coupled between the fifth node ND5 and the second power supply voltage terminal, and may have a gate which is coupled with the fifth node ND5. The sixth NMOS transistor N6 may be coupled between the sixth node ND6 and the second power supply voltage terminal, and may have a gate which is coupled with the fifth node ND5. The sixth NMOS transistor N6 may change a voltage level of the sixth node ND6 depending on a change in a voltage level of the fifth node ND5, and may generate the first bias signal VBO through the sixth node ND6. A second capacitor C2 for stabilizing a voltage level of the first bias signal VBO may be coupled between the sixth node ND6 and the second power supply voltage terminal.

Figure 4:
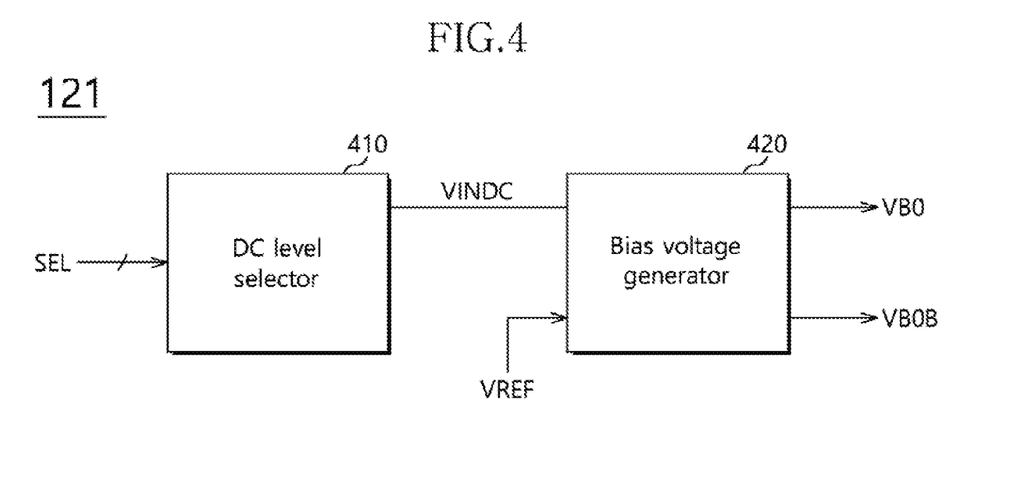
FIG. 4 is a diagram illustrating a configuration of the bias signal generation circuit illustrated in FIG. 1.

FIG. 4 is a diagram illustrating a configuration of the bias signal generation circuit 121 illustrated in FIG. 1. Referring to FIG. 4, the bias signal generation circuit 121 may include a DC level selector 410 and a bias voltage generator 420. The DC level selector 410 may receive the select signal SEL, and thereby, may generate the DC level signal VINDC. The DC level selector 410 may generate a plurality of divided voltages by dividing voltages between the first power supply voltage VH and the second power supply voltage VL, and may select a divided voltage which has a specific level, among the plurality of divided voltages. The selected divided voltage may be outputted as the DC level signal VINDC. The bias voltage generator 420 may be substantially the same as the configuration illustrated in FIGS. 2 and 3.

Figure 5:
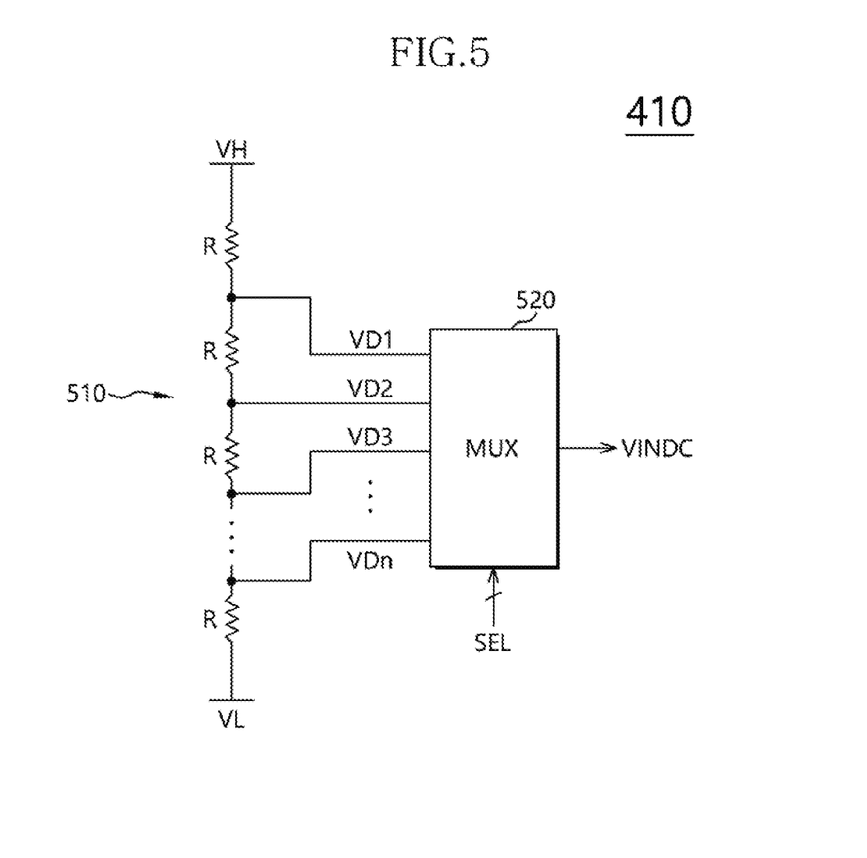
FIG. 5 is a diagram illustrating configuration of the DC level selector illustrated in FIG. 4.

FIG. 5 is a diagram illustrating a configuration of the DC level selector 410 illustrated in FIG. 4. Referring to FIG. 5, the DC level selector 410 may include a resistor ladder 510 and a multiplexer (MUX) 520. The resistor ladder 510 may include a plurality of resistors R which are coupled in series between the first power supply voltage terminal which receives the first power supply voltage VH and the second power supply voltage terminal which receives the second power supply voltage VL. The plurality of resistors R may have the same resistance value, or some or all of them may have different resistance values. The resistor ladder 510 may output a plurality of divided voltages VD1, VD2, VD3, . . . and VDn from the respective resistors R. The multiplexer 520 may receive the plurality of divided voltages VD1, VD2, VD3, . . . and VDn from the resistor ladder 510. The multiplexer 520 may output at least one among the plurality of divided voltages VD1, VD2, VD3, . . . and VDn as the DC level signal VINDC based on the select signal SEL.

Figure 6:
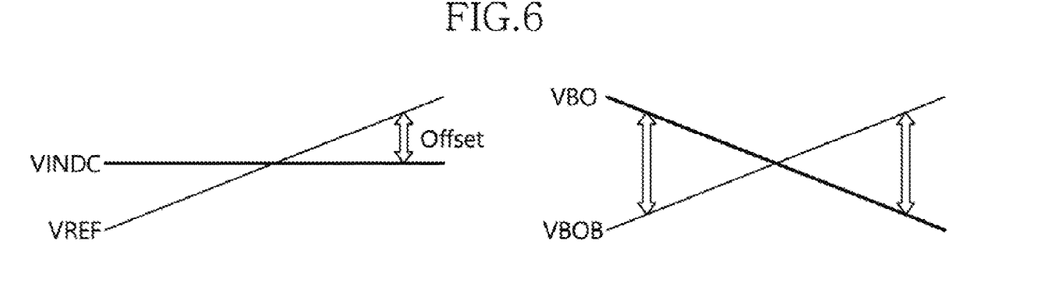
FIG. 6 is a diagram to assist in the explanation of the operation of the bias signal generation circuit in accordance with an embodiment.
Figure 7:
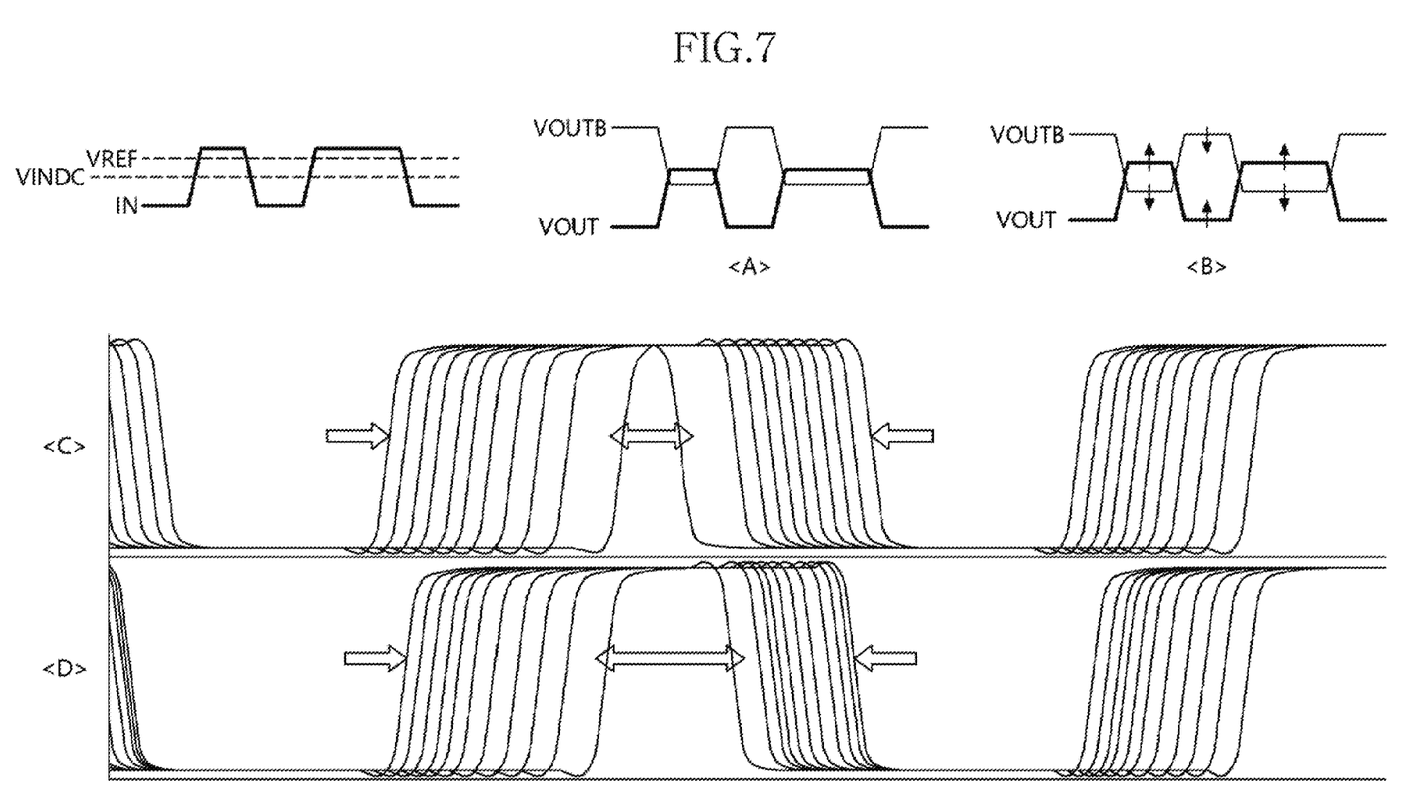
FIG. 7 is a diagram to assist in the explanation of the operation of the signal receiver circuit in accordance with an embodiment.

FIG. 6 is a diagram to assist in the explanation of the operation of the bias signal generation circuit 121 in accordance with an embodiment, and FIG. 7 is a diagram to assist in the explanation of the operation of the signal receiver circuit 100 in accordance with an embodiment. The operation of the signal receiver circuit 100 in accordance with the embodiments will be described below with reference to FIGS. 1 to 7. Referring to FIG. 6, in the case where an offset exists between a DC level of the input signal VIN and a voltage level of the reference voltage VREF, the bias signal generation circuit 121 may generate the first and second bias signals VBO and VBOB in such a way to compensate for the offset. For example, the bias signal generation circuit 121 may increase a voltage level difference between the first and second bias signals VBO and VBOB as a voltage level difference between the DC level signal VINDC and the reference voltage VREF is large. Conversely, the bias signal generation circuit 121 may decrease a voltage level difference between the first and second bias signals VBO and VBOB as a voltage level difference between the DC level signal VINDC and the reference voltage VREF is small. The bias signal generation circuit 121 may generate the first bias signal VBO which has a level higher than the second bias signal VBOB, when the DC level signal VINDC has a voltage level higher than the reference voltage VREF. The bias signal generation circuit 121 may generate the first bias signal VBO which has a level lower than the second bias signal VBOB, when the DC level signal VINDC has a voltage level lower than the reference voltage VREF.

Referring to FIG. 7, there is illustrated a case where an offset exists between a DC level of the input signal VIN and the reference voltage VREF and thereby a DC level of the input signal VIN is lower than a voltage level of the reference voltage VREF. In the case where a level of the reference voltage VREF is higher than a DC level of the input signal VIN, as illustrated in <A>, the first output signal VOUT which is outputted from the signal receiver circuit 100 may be generated within a relatively low voltage level range, whereas the second output signal VOUTB may be generated within a relatively high voltage level range. Therefore, as illustrated in <C>, a valid duration of a high level period of the first output signal VOUT may be decreased, and a duty ratio thereof may also deteriorate. In the case where a level of the reference voltage VREF is higher than a DC level of the input signal VIN, the bias signal generation circuit 121 may generate the first and second bias signals VBO and VBOB such that the second bias signal VBOB has a level higher than the first bias signal VBO. When the input signal VIN is at a high level, the first amplified signal AOUT which has a high level and the second amplified signal AOUTB which has a low level may be outputted from the first amplification circuit 110. The voltage adjusting circuit 122 may relatively decrease a voltage level of the second amplified signal AOUTB based on the first amplified signal AOUT and the second bias signal VBOB. Also, the voltage adjusting circuit 122 may relatively increase a voltage level of the first amplified signal AOUT based on the second amplified signal AOUTB and the first bias signal VBO. Thus, as illustrated in <B>, a difference between a voltage level of a high level period of the first amplified signal AOUT and a voltage level of a low level period of the second amplified signal AOUTB which are compensated by the offset compensation circuit 120 may be increased.

When the input signal VIN is at a low level, the first amplified signal AOUT which has a low level and the second amplified signal AOUTB which has a high level may be outputted from the first amplification circuit 110. The voltage adjusting circuit 122 may relatively decrease a voltage level of the second amplified signal AOUTB based on the first amplified signal AOUT and the second bias signal VBOB. Also, the voltage adjusting circuit 122 may relatively increase a voltage level of the first amplified signal AOUT based on the second amplified signal AOUTB and the first bias signal VBO. Thus, as illustrated in <B>, a difference between a voltage level of a low level period of the first amplified signal AOUT and a voltage level of a high level period of the second amplified signal AOUTB which are compensated by the offset compensation circuit 120 may be decreased.

If a difference between a voltage level of a high level period of the first amplified signal AOUT and a voltage level of a low level period of the second amplified signal AOUTB is increased and a difference between a voltage level of a low level period of the first amplified signal AOUT and a voltage level of a high level period of the second amplified signal AOUTB is decreased, as illustrated in <D>, a valid duration of a high level period of the first output signal VOUT which is generated from the second amplification circuit 130 may be increased, and a duty ratio thereof may be improved.

Figure 8:
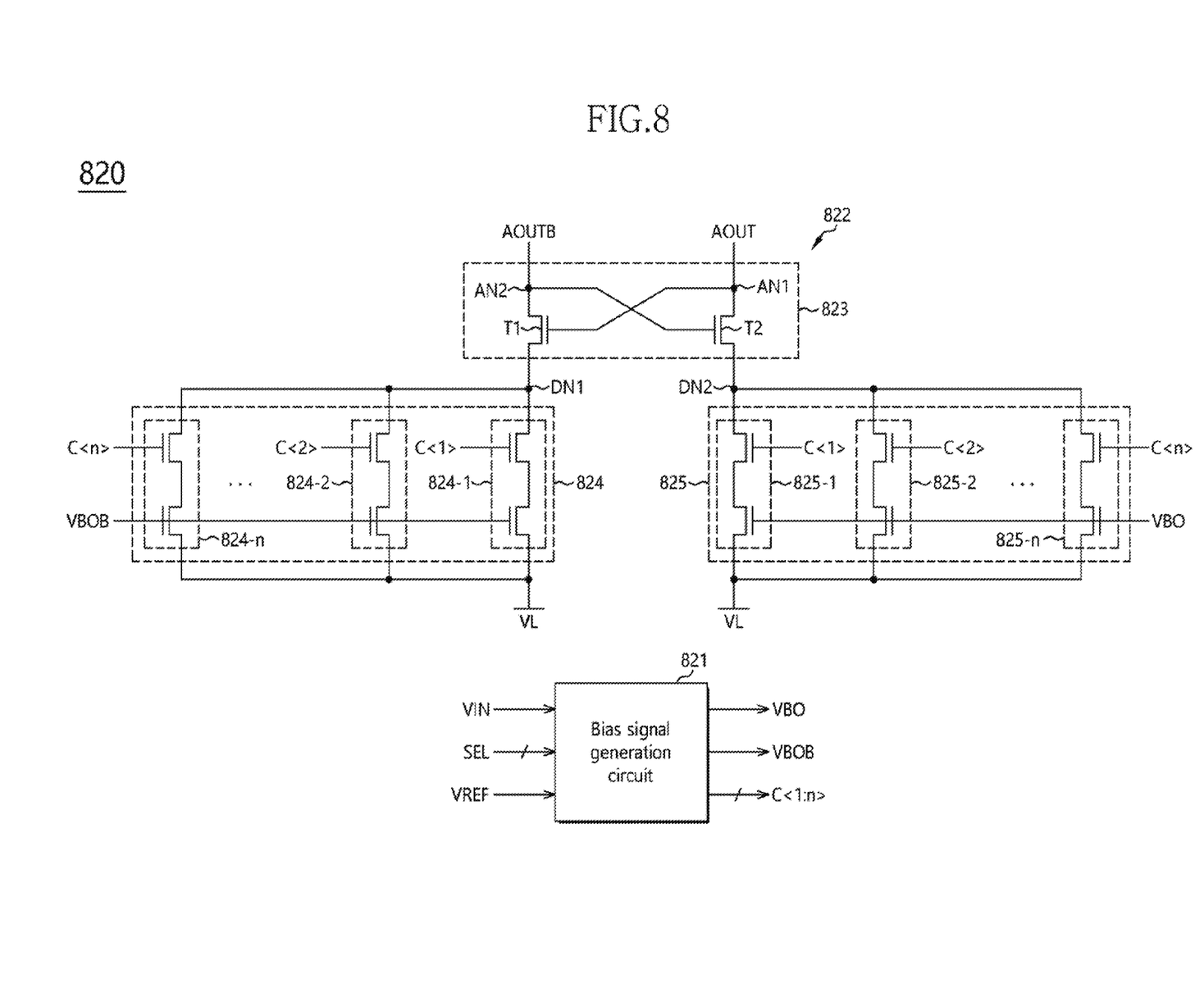
FIG. 8 is a diagram illustrating a configuration of an offset compensation circuit in accordance with an embodiment.

FIG. 8 is a diagram illustrating a configuration of an offset compensation circuit 820 in accordance with an embodiment. Referring to FIG. 8, the offset compensation circuit 820 may include a bias signal generation circuit 821 and a voltage adjusting circuit 822. The offset compensation circuit 820 may be applied to the signal receiver circuit 100 in replacement of the offset compensation circuit 120 illustrated in FIG. 1. The bias signal generation circuit 821 may generate the first bias signal VBO and the second bias signal VBOB based on at least one of the input signal VIN and the select signal SEL. The bias signal generation circuit 821 may further generate current code signals C<1:n>. The current code signals C<1:n> may be generated to finely adjust voltage levels of the first and second amplified signals AOUT and AOUTB.

The voltage adjusting circuit 822 may include a cross-coupling circuit 823, a first variable current circuit 824 and a second variable current circuit 825. The voltage adjusting circuit 822 may have substantially the same configuration and perform substantially the same operation as the voltage adjusting circuit 122 except that the first and second current circuits 124 and 125 illustrated in FIG. 1 are replaced with the first and second variable current circuits 824 and 825.

The cross-coupling circuit 823 may receive the first amplified signal AOUT through the first amplification node AN1, and may receive the second amplified signal AOUTB through the second amplification node AN2. The cross-coupling circuit 823 may couple the second amplification node AN2 with the first discharge node DN1 based on the first amplified signal AOUT, and may couple the first amplification node AN1 with the second discharge node DN2 based on the second amplified signal AOUTB.

The first variable current circuit 824 may be coupled between the first discharge node DN1 and the second power supply voltage terminal which receives the second power supply voltage VL. The first variable current circuit 824 may include a plurality of current circuits 824-1, 824-2, . . . and 824-n which are coupled in parallel between the first discharge node DN1 and the second power supply voltage terminal. The plurality of current circuits 824-1, 824-2, . . . and 824-n may receive the current code signals C<1:n> respectively allocated thereto, and may adjust an amount of current flowing from the first discharge node DN1 to the second power supply voltage terminal, based on the second bias signal VBOB. The second variable current circuit 825 may be coupled between the second discharge node DN2 and the second power supply voltage terminal. The second variable current circuit 825 may include a plurality of current circuits 825-1, 825-2, . . . and 825-n which are coupled in parallel between the second discharge node DN2 and the second power supply voltage terminal. The plurality of current circuits 825-1, 825-2, . . . and 825-n may receive the current code signals C<1:n> respectively allocated thereto, and may adjust an amount of current flowing from the second discharge node DN2 to the second power supply voltage terminal, based on the first bias signal VBO. The voltage adjusting circuit 822 may finely adjust voltage levels of the first and second amplified signals AOUT and AOUTB by further receiving the current code signals C<1:n>.

Figure 9:
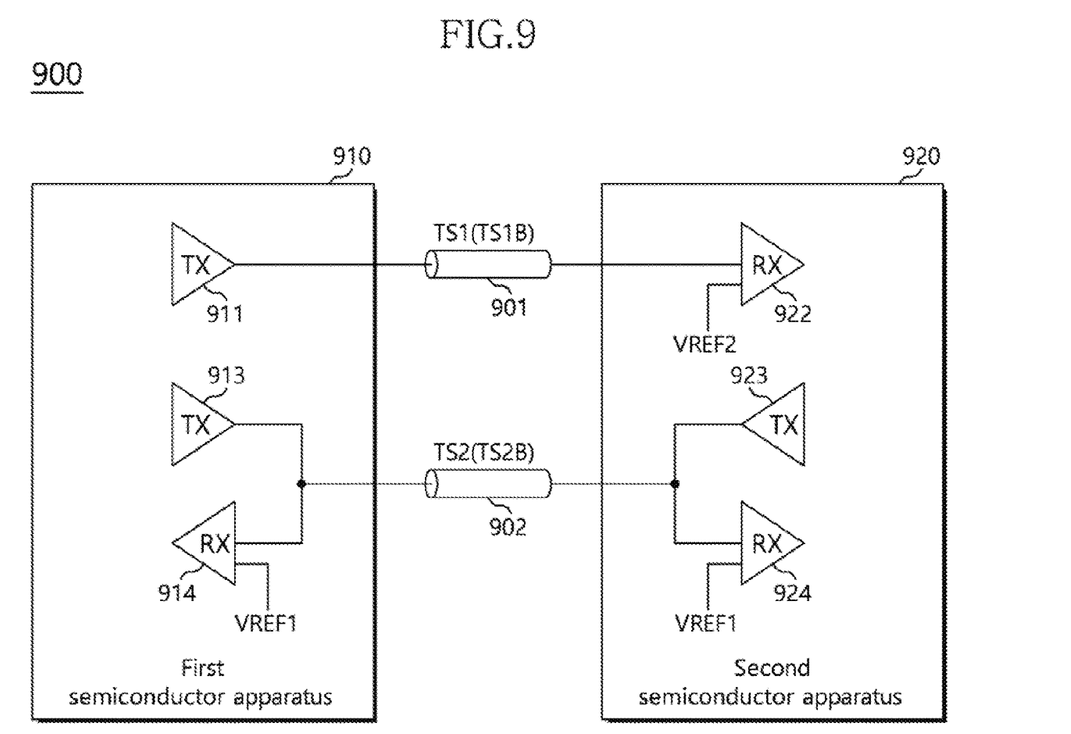
FIG. 9 is a diagram illustrating a configuration of a semiconductor system in accordance with an embodiment.

FIG. 9 is a diagram illustrating a configuration of a semiconductor system 900 in accordance with an embodiment. Referring to FIG. 9, the semiconductor system 900 may include a first semiconductor apparatus 910 and a second semiconductor apparatus 920. The first semiconductor apparatus 910 may provide various control signals which are used for the second semiconductor apparatus 920 to operate. The first semiconductor apparatus 910 may include various types of host apparatuses. For example, the first semiconductor apparatus 910 may be a host apparatus such as a central processing unit (CPU), a graphic processing unit (GPU), a multimedia processor (MMP), a digital signal processor, an application processor (AP) and a memory controller. The second semiconductor apparatus 920 may be, for example, a memory apparatus, and the memory apparatus may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The second semiconductor apparatus 920 may be coupled with the first semiconductor apparatus 910 through a first bus 901 and a second bus 902. The first and second buses 901 and 902 may be signal transmission paths, links or channels for transmitting signals. The first bus 901 may be a unidirectional bus. The first semiconductor apparatus 910 may transmit a first signal TS1 to the second semiconductor apparatus 920 through the first bus 901, and the second semiconductor apparatus 920 may be coupled with the first bus 901 and thereby receive the first signal TS1 transmitted from the first semiconductor apparatus 910. The first signal TS1 may include, for example, control signals such as a command signal, a clock signal and an address signal. The second bus 902 may be a bidirectional bus. The first semiconductor apparatus 910 may transmit a second signal TS2 to the second semiconductor apparatus 920 through the second bus 902, or may receive the second signal TS2 transmitted from the second semiconductor apparatus 920, through the second bus 902. The second semiconductor apparatus 920 may transmit the second signal TS2 to the first semiconductor apparatus 910 through the second bus 902, or may receive the second signal TS2 transmitted from the first semiconductor apparatus 910, through the second bus 902. The second signal TS2 may be, for example, data. In an embodiment, the first and second signals TS1 and TS2 may be transmitted through the first and second buses 901 and 902, respectively, as pairs of differential signals together with complementary signals TS1B and TS2B. In an embodiment, the first and second signals TS1 and TS2 may be transmitted through the first and second buses 901 and 902, respectively, as single-ended signals.

The first semiconductor apparatus 910 may include a first signal transmitter circuit (TX) 911, a second signal transmitter circuit (TX) 913 and a signal receiver circuit (RX) 914. The first signal transmitter circuit 911 may be coupled with the first bus 901, and may drive the first bus 901 based on an internal signal of the first semiconductor apparatus 910 and thereby transmit the first signal TS1 to the second semiconductor apparatus 920. The second signal transmitter circuit 913 may be coupled with the second bus 902, and may drive the second bus 902 based on an internal signal of the first semiconductor apparatus 910 and thereby transmit the second signal TS2 to the second semiconductor apparatus 920. The signal receiver circuit 914 may be coupled with the second bus 902, and may receive the second signal TS2 transmitted from the second semiconductor apparatus 920, through the second bus 902. The signal receiver circuit 914 may generate an internal signal to be used in the first semiconductor apparatus 910, by differentially amplifying the second signal TS2 transmitted through the second bus 902. When a pair of differential signals are transmitted through the second bus 902, the signal receiver circuit 914 may generate the internal signal by differentially amplifying the second signal TS2 and the complementary signal TS2B of the second signal TS2. When a single-ended signal is transmitted through the second bus 902, the signal receiver circuit 914 may generate the internal signal by differentially amplifying the second signal TS2 and a first reference voltage VREF1. The first reference voltage VREF1 may have a voltage level corresponding to the middle of a range through which the second signal TS2 swings. The signal receiver circuit 100 illustrated in FIG. 1 may be applied as the signal receiver circuit 914.

The second semiconductor apparatus 920 may include a first signal receiver circuit (RX) 922, a signal transmitter circuit (TX) 923 and a second signal receiver circuit (RX) 924. The first signal receiver circuit 922 may be coupled with the first bus 901, and may receive the first signal TS1 transmitted from the first semiconductor apparatus 910, through the first bus 901. The first signal receiver circuit 922 may generate an internal signal to be used in the second semiconductor apparatus 920, by differentially amplifying the first signal TS1 transmitted through the first bus 901. When a pair of differential signals are transmitted through the first bus 901, the first signal receiver circuit 922 may generate the internal signal by differentially amplifying the first signal TS1 and the complementary signal TS1B of the first signal TS1. When a single-ended signal is transmitted through the first bus 901, the first signal receiver circuit 922 may generate the internal signal by differentially amplifying the first signal TS1 and a second reference voltage VREF2. The second reference voltage VREF2 may have a voltage level corresponding to the middle of a range through which the first signal TS1 swings. The signal transmitter circuit 923 may be coupled with the second bus 902, and may drive the second bus 902 based on an internal signal of the second semiconductor apparatus 920 and thereby transmit the second signal TS2 to the first semiconductor apparatus 910. The second signal receiver circuit 924 may be coupled with the second bus 902, and may receive the second signal TS2 transmitted from the first semiconductor apparatus 910, through the second bus 902. The second signal receiver circuit 924 may generate an internal signal to be used in the second semiconductor apparatus 920, by differentially amplifying the second signal TS2 transmitted through the second bus 902. When a pair of differential signals are transmitted through the second bus 902, the second signal receiver circuit 924 may generate the internal signal by differentially amplifying the second signal TS2 and the complementary signal TS2B of the second signal TS2. When a single-ended signal is transmitted through the second bus 902, the second signal receiver circuit 924 may generate the internal signal by differentially amplifying the second signal TS2 and the first reference voltage VREF1. The signal receiver circuit 100 illustrated in FIG. 1 may be applied as each of the first and second signal receiver circuits 922 and 924.

While various embodiments have been described above, it will be understood to those skilled in the art that the embodiments described are examples only. Accordingly, the signal receiver circuit, and the semiconductor apparatus and semiconductor system including the same described herein should not be limited based on the described embodiments.

What is claimed is:

1. A signal receiver circuit comprising:
  a first amplification circuit configured to amplify an input signal and a reference voltage to output a first amplified signal through a first amplification node and output a second amplified signal through a second amplification node;
  a voltage adjusting circuit configured to change a voltage level of the first amplified signal based on the second amplified signal and a first bias signal, and change a voltage level of the second amplified signal based on the first amplified signal and a second bias signal; and
  a bias signal generation circuit configured to compare a DC (direct current) level of the input signal and the reference voltage to generate the first bias signal and the second bias signal,
  wherein the DC level of the input signal is a middle voltage level between a maximum voltage and a minimum voltage of the input signal.

2. The signal receiver circuit according to claim 1, wherein the bias signal generation circuit generates the first bias signal to have a higher voltage level than a voltage level of the second bias signal when the DC level of the input signal is higher than the reference voltage, and
  the bias signal generation circuit generates the first bias signal to have a lower voltage level than the voltage level of the second bias signal when the DC level of the input signal is lower than the reference voltage.

3. The signal receiver circuit according to claim 1, wherein the voltage adjusting circuit comprises:
a cross-coupling circuit configured to couple the second amplification node and a first discharge node based on the first amplified signal, and couple the first amplification node and a second discharge node based on the second amplified signal;
a first current circuit configured to adjust an amount of current flowing from the first discharge node to a power supply voltage terminal based on the second bias signal; and
a second current circuit configured to adjust an amount of current flowing from the second discharge node to the power supply voltage terminal based on the first bias signal.

4. The signal receiver circuit according to claim 1, wherein the voltage adjusting circuit comprises:
a first transistor coupled between the second amplification node and a first discharge node, and having a gate which is coupled with the first amplification node;
a second transistor coupled between the first amplification node and a second discharge node, and having a gate which is coupled with the second amplification node;
a third transistor coupled between the first discharge node and a power supply voltage terminal, and having a gate which receives the second bias signal; and
a fourth transistor coupled between the second discharge node and the power supply voltage terminal, and having a gate which receives the first bias signal.

5. The signal receiver circuit according to claim 1, wherein the bias signal generation circuit comprises:
a DC level detector configured to detect a DC level of the input signal to generate a DC level signal; and
a bias voltage generator configured to compare the DC level signal and the reference voltage to generate the first bias signal and the second bias signal.

6. The signal receiver circuit according to claim 1, wherein the bias signal generation circuit comprises:
a DC level selector configured to generate a plurality of divided voltages, and output at least one of the plurality of divided voltages as a DC level signal based on a select signal generated based on a characteristic of a channel through which the input signal is transmitted; and
a bias voltage generator configured to compare the DC level signal and the reference voltage to generate the first bias signal and the second bias signal.

7. The signal receiver circuit according to claim 1, wherein the bias signal generation circuit further generates a current code signal, and
wherein the voltage adjusting circuit comprises:
a cross-coupling circuit configured to couple the second amplification node and a first discharge node based on the first amplified signal, and couple the first amplification node and a second discharge node based on the second amplified signal;
a first variable current circuit configured to adjust an amount of current flowing from the first discharge node to a power supply voltage terminal based on the current code signal and the second bias signal; and
a second variable current circuit configured to adjust an amount of current flowing from the second discharge node to the power supply voltage terminal based on the current code signal and the first bias signal.

8. The signal receiver circuit according to claim 1, further comprising:
a second amplification circuit configured to amplify the first amplified signal and the second amplified signal to generate a first output signal and a second output signal.

9. A signal receiver circuit comprising:
a first amplification circuit configured to amplify an input signal and a reference voltage to generate a first amplified signal through a first amplification node and generate a second amplified signal through a second amplification node;
a second amplification circuit configured to amplify the first amplified signal and the second amplified signal to generate a first output signal and a second output signal;
a bias signal generation circuit configured to compare a DC (direct current) level of the input signal and the reference voltage to generate a first bias signal and a second bias signal; and
a voltage adjusting circuit configured to change voltage levels of the first and second amplified signals based on the first amplified signal, the second amplified signal, the first bias signal and the second bias signal,
wherein the DC level of the input signal is a middle voltage level between a maximum voltage and a minimum voltage of the input signal.

10. The signal receiver circuit according to claim 9, wherein the bias signal generation circuit generates the first bias signal to have a higher voltage level than a voltage level of the second bias signal when the DC level of the input signal is higher than the reference voltage, and
the bias signal generation circuit generates the first bias signal to have a lower voltage level than the voltage level of the second bias signal when the DC level of the input signal is lower than the reference voltage.

11. The signal receiver circuit according to claim 9, wherein the bias signal generation circuit comprises:
a DC level detector configured to generate a DC level signal by detecting a DC level of the input signal; and
a bias voltage generator configured to generate the first bias signal and the second bias signal by comparing the DC level signal and the reference voltage.

12. The signal receiver circuit according to claim 9, wherein the bias signal generation circuit comprises:
a DC level selector configured to generate a plurality of divided voltages, and output at least one of the plurality of divided voltages as a DC level signal based on a select signal generated based on a characteristic of a channel through which the input signal is transmitted; and
a bias voltage generator configured to generate the first bias signal and the second bias signal by comparing the DC level signal and the reference voltage.

13. The signal receiver circuit according to claim 9, wherein the voltage adjusting circuit changes a voltage level of the first amplified signal based on the first bias signal and the second amplified signal, and changes a voltage level of the second amplified signal based on the second bias signal and the first amplified signal.

14. The signal receiver circuit according to claim 9, wherein the voltage adjusting circuit comprises:
a cross-coupling circuit configured to couple the second amplification node and a first discharge node based on the first amplified signal, and couple the first amplification node and a second discharge node based on the second amplified signal;

a first current circuit configured to adjust an amount of current flowing from the first discharge node to a ground voltage terminal based on the second bias signal; and a second current circuit configured to adjust an amount of current flowing from the second discharge node to the ground voltage terminal based on the first bias signal.

15. The signal receiver circuit according to claim 9, wherein the voltage adjusting circuit comprises:

a first transistor coupled between the second amplification node and a first discharge node, and having a gate which is coupled with the first amplification node;

a second transistor coupled between the first amplification node and a second discharge node, and having a gate which is coupled with the second amplification node;

a third transistor coupled between the first discharge node and a ground voltage terminal, and having a gate which receives the second bias signal; and a fourth transistor coupled between the second discharge node and the ground voltage terminal, and having a gate which receives the first bias signal.

16. The signal receiver circuit according to claim 9, wherein the bias signal generation circuit further generates a current code signal, and
wherein the voltage adjusting circuit comprises:

a cross-coupling circuit configured to couple the second amplification node and a first discharge node based on the first amplified signal, and couple the first amplification node and a second discharge node based on the second amplified signal;

a first variable current circuit configured to adjust an amount of current flowing from the first discharge node to a power supply voltage terminal based on the current code signal and the second bias signal; and a second variable current circuit configured to adjust an amount of current flowing from the second discharge node to the power supply voltage terminal based on the current code signal and the first bias signal.

17. A signal receiver circuit comprising:

a first amplification circuit configured to amplify an input signal and a reference voltage to generate a first amplified signal and a second amplified signal;

a second amplification circuit configured to amplify the first amplified signal and the second amplified signal to generate a first output signal and a second output signal; and an offset compensation circuit configured to generate a first bias signal and a second bias signal by comparing a DC level of the input signal and to change voltage levels of the first and second amplified signals based on the first amplified signal, the second amplified signal, the first bias signal, and the second bias signal, wherein the DC level of the input signal is a middle voltage level between a maximum voltage and a minimum voltage of the input signal.

18. The signal receiver circuit according to claim 17, wherein the offset compensation circuit changes voltage levels of the first and second amplified signals based on the first amplified signal, the second amplified signal, the first bias signal and the second bias signal, and
wherein the offset compensation circuit generates the first bias signal to have a higher voltage level than a voltage level of the second bias signal when the DC level of the input signal is higher than the reference voltage, and the offset compensation circuit generates the first bias signal to have a lower voltage level than the voltage level of the second bias signal when the DC level of the input signal is lower than the reference voltage.

19. The signal receiver circuit according to claim 17, wherein the offset compensation circuit comprises:

a bias signal generation circuit configured to compare the DC level of the input signal and the reference voltage to generate the first bias signal and the second bias signal; and a voltage adjusting circuit configured to change voltage levels of the first and second amplified signals based on the first amplified signal, the second amplified signal, the first bias signal and the second bias signal.

20. The signal receiver circuit according to claim 19, wherein the bias signal generation circuit comprises:

a DC level detector configured to generate a DC level signal by detecting the DC level of the input signal; and a bias voltage generator configured to generate the first bias signal and the second bias signal by comparing the DC level signal and the reference voltage.

21. The signal receiver circuit according to claim 19, wherein the bias signal generation circuit comprises:

a DC level selector configured to generate a plurality of divided voltages by dividing a voltage, and output at least one of the plurality of divided voltages as a DC level signal based on a select signal generated based on a characteristic of a channel through which the input signal is transmitted; and a bias voltage generator configured to generate the first bias signal and the second bias signal by comparing the DC level signal and the reference voltage.

22. The signal receiver circuit according to claim 19, wherein the voltage adjusting circuit changes a voltage level of the first amplified signal based on the first bias signal and the second amplified signal, and changes a voltage level of the second amplified signal based on the second bias signal and the first amplified signal.

23. The signal receiver circuit according to claim 19, wherein the voltage adjusting circuit comprises:

a cross-coupling circuit configured to couple the second amplification node and a first discharge node based on the first amplified signal, and couple the first amplification node and a second discharge node based on the second amplified signal;

a first current circuit configured to adjust an amount of current flowing from the first discharge node to a ground voltage terminal based on the second bias signal; and a second current circuit configured to adjust an amount of current flowing from the second discharge node to the ground voltage terminal based on the first bias signal.

24. The signal receiver circuit according to claim 19, wherein the voltage adjusting circuit comprises:

a first transistor coupled between the second amplification node and a first discharge node, and having a gate which is coupled with the first amplification node;

a second transistor coupled between the first amplification node and a second discharge node, and having a gate which is coupled with the second amplification node;

a third transistor coupled between the first discharge node and a ground voltage terminal, and having a gate which receives the second bias signal; and a fourth transistor coupled between the second discharge node and the ground voltage terminal, and having a gate which receives the first bias signal.

25. The signal receiver circuit according to claim 19, wherein the bias signal generation circuit further generates a current code signal, and wherein the voltage adjusting circuit comprises:
a cross-coupling circuit configured to couple the second amplification node and a first discharge node based on the first amplified signal, and couple the first amplification node and a second discharge node based on the second amplified signal;
a first variable current circuit configured to adjust an amount of current flowing from the first discharge node to a power supply voltage terminal based on the current code signal and the second bias signal; and
a second variable current circuit configured to adjust an amount of current flowing from the second discharge node to the power supply voltage terminal based on the current code signal and the first bias signal.

26. The signal receiver circuit according to claim 17, wherein the reference voltage has a middle voltage level of a range, through which the input signal can swing, and
wherein the DC level of the input signal has a middle voltage level of a range through which the input signal actually swings.

\* \* \* \* \*